(12) United States Patent  
Holderer et al.

(10) Patent No.: US 7,791,711 B2
(45) Date of Patent: Sep. 7, 2010

(54) PROJECTION METHOD INCLUDING PUPILLARY FILTERING AND A PROJECTION LENS THEREFOR

(75) Inventors: Hubert Holderer, Oberkochen (DE); Christian Hembd-Soellner, Stuttgart (DE); Rudolf Von Buenau, Essingen (DE); Ulrich Haag, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 191 days.

(21) Appl. No.: 12/036,903

(22) Filed: Feb. 25, 2008

(65) Prior Publication Data

US 2008/0143984 A1  Jun. 19, 2008

Related U.S. Application Data (63) Continuation of application No. 10/975,496, filed on Oct. 29, 2004, now Pat. No. 7,336,342, which is a continuation of application No. PCT/EP03/04013, filed on Apr. 17, 2003.

(30) Foreign Application Priority Data

Apr. 29, 2002  (DE) ................ 102 20 324

(51) Int. Cl.
  *G03B 27/32* (2006.01)
  *G03B 27/42* (2006.01)
  *G03B 27/54* (2006.01)
(52) U.S. Cl. ............... 355/77; 355/53; 355/67
(58) Field of Classification Search .......... 355/52, 355/53, 55, 67–71, 77; 356/399–401; 250/548
See application file for complete search history.

(56) References Cited

U.S. PATENT DOCUMENTS 5,144,362 A  9/1992  Kamon et al.
5,222,112 A  6/1993  Terasawa et al.
5,402,267 A  3/1995  Fuerter et al.
5,418,598 A  5/1995  Fukuda et al.

(Continued)

FOREIGN PATENT DOCUMENTS

DE  42 03 464 A1  8/1992

(Continued)

OTHER PUBLICATIONS

Rudolf M. von Bünau and Hiroshi Fukuda, Printing Isolated Features with $\kappa_1$=0.2 Using Multiple-Pupil Exposure, Jpn. J. Appl. Phys., Dec. 1996, vol. 35, Part 1, No. 12B, pp. 6400-6403.

(Continued)

*Primary Examiner*—Hung Henry Nguyen
(74) *Attorney, Agent, or Firm*—Sughrue Mion, PLLC (57) ABSTRACT

Processes for producing semiconductor components and/or other finely structured components include providing a projection objective having a mirror that is located within a predetermined proximity to a pupil surface of a projection objective. In one variant, an image of a pattern is projected onto a light-sensitive substrate in multiple exposures, in which a first pupil filter function is set on the mirror during a first exposure and, during a subsequent, second exposure, a different, second pupil filter function is set by local changes of geometric reflective properties of the mirror in a locally resolving manner.

32 Claims, 4 Drawing Sheets

U.S. PATENT DOCUMENTS

| | | |
|---|---|---|
| 5,448,336 A | 9/1995 | Shiraishi |
| 5,524,039 A | 6/1996 | Kamon |
| 5,537,260 A | 7/1996 | Williamson |
| 5,595,857 A | 1/1997 | Fukuda et al. |
| 5,610,684 A | 3/1997 | Shiraishi |
| 5,677,757 A * | 10/1997 | Taniguchi et al. ............ 355/71 |
| 5,689,377 A | 11/1997 | Takahashi |
| 6,304,317 B1 | 10/2001 | Taniguchi et al. |
| 6,307,688 B1 | 10/2001 | Merz et al. |
| 6,333,780 B1 | 12/2001 | Tsukuda |
| 6,339,471 B1 * | 1/2002 | Morita ...................... 356/401 |
| 6,388,823 B1 | 5/2002 | Gaber et al. |
| 6,404,482 B1 | 6/2002 | Shiraishi |
| 6,658,084 B2 | 12/2003 | Singer |
| 6,737,662 B2 | 5/2004 | Mulder et al. |
| 6,750,948 B2 | 6/2004 | Omura |
| 6,784,977 B2 | 8/2004 | Von Buenau et al. |
| 7,112,772 B2 | 9/2006 | Wagner et al. |
| 2002/0048096 A1 | 4/2002 | Melzer et al. |
| 2002/0196533 A1 | 12/2002 | Shafer et al. |
| 2004/0169914 A1 | 9/2004 | Shafer et al. |
| 2005/0280910 A1 | 12/2005 | Fehr et al. |

FOREIGN PATENT DOCUMENTS

| | | |
|---|---|---|
| DE | 195 02 827 A1 | 8/1995 |
| DE | 101 20 446 A1 | 11/2002 |
| EP | 048 50 62 A2 | 5/1992 |
| EP | 063 88 47 A1 | 2/1995 |
| EP | 073 67 89 A2 | 10/1996 |
| EP | 09 89 434 A2 | 3/2000 |
| JP | 01271088 | 4/1988 |
| JP | 08-334695 | 1/1995 |
| JP | 07-029808 | 12/1996 |
| JP | 09298154 A | 11/1997 |
| JP | 11003849 A | 1/1999 |

OTHER PUBLICATIONS

Rudolf M. von Bünau et al., Effects of radially non-symmetric pupil filters and multiple-pupil exposure, SPIE, vol. 2726, pp. 375-385.

* cited by examiner

PROJECTION METHOD INCLUDING PUPILLARY FILTERING AND A PROJECTION LENS THEREFOR

This is a Continuation of application Ser. No. 10/975,496, filed Oct. 29, 2004, which is a Continuation Application of PCT Application No. PCT/EP03/04013, filed Apr. 17, 2003, which was published under PCT Article 21(2) in German and which claims priority from German Patent Application DE 102 20 324.5, filed on Apr. 29, 2002. The entire disclosures of application Ser. No. 10/975,496, of Application number PCT/EP03/04013 and of Application DE 102 20 324.5 are hereby incorporated into the present application by reference.

BACKGROUND OF THE INVENTION

1. Field of the Invention

The invention relates to a method of imaging a pattern arranged in the object plane of an optical imaging system into the image plane of the imaging system, and an imaging system for carrying out the method. The preferred area of application of the invention is projection objectives for microlithography.

2. Description of the Prior Art

Catadioptric or catoptric projection objectives are used in projection exposure installations for the production of semiconductor components and other finely structured components. They have at least one concave mirror and are used to image patterns of photomasks or graduated plates, which in the following text will generally be designated masks or reticles, onto an object arranged in the image plane of the projection objective and coated with a light-sensitive layer, at the highest resolution and on a reducing scale.

Since the resolving power of optical imaging systems is proportional to the wavelength $\lambda$ of the light used and inversely proportional to the image-side numerical aperture (NA) of the optical imaging system, in order to produce finer and finer structures, the aim is firstly to enlarge the image-side numerical aperture of the projection objectives and secondly to use shorter and shorter wavelengths, preferably ultraviolet light with wavelengths of less than about 260 nm.

In addition to the resolving power, the depth of focus (DOF) that can be achieved during the imaging plays an important role for imaging that is faithful to the original. The depth of focus is likewise proportional to the wavelength used but inversely proportional to the square of the numerical aperture. Therefore, any increase in the numerical aperture without suitable measures for providing an adequate depth of focus is expedient only to a limited extent.

In order to improve the resolution and the depth of focus of microlithographic projection objectives, it is known to use pupil filters. The use of pupil filters is sometimes also designated optical filtering or apodisation. Here, pupil filter designates a spatial filter which is arranged in the region of a pupil surface of a projection system. This pupil surface, which is generally flat, is a Fourier-transformed surface in relation to the object plane and to the image plane. This means, for example, that a specific angle of incidence of light in the image plane of the projection objective corresponds to a specific radial coordinate in the pupil plane. With the aid of locally resolving filtering in the region of the pupil surface, it is therefore possible to exert an influence on the angular spectrum of the rays contributing to the imaging.

U.S. Pat. No. 5,222,112 shows a purely reflective catoptric projection objective for soft X radiation in which, in the region of a pupil, there is arranged a convex mirror whose mirror surface has a reflectance which decreases from the center toward the edge. As a result, an amplitude filter having a fixedly predefined, rotationally symmetrical filter function is created. In addition to amplitude filters which, for example, mask out specific different diffraction orders in the region of the pupil surface, phase filters are also known which, according to a predefined local filter function in the pupil surface, effect phase shifting of the light passing through in specific zones of the pupil surface. An explanation of the functioning of pupil filters and also examples of projection objectives having such filters are shown, for example, in EP 0 485 062 B1 or U.S. Pat. No. 5,144,362 and in the texts cited there.

In order to achieve the optimum benefit of pupil filtering, it is expedient to adapt the mode of action of a pupil filter, determined by the construction of the pupil filter, to the type of reticle structures to be imaged. Accordingly, pupil filters are optimized for specific reticle structures (for example contact holes, grid structures with one or more periodicity directions). Since reticles with an extremely wide range of structures are intended to be imaged by a projection objective, it is desirable to be able to use pupil filters with different effects as desired. For this purpose, U.S. Pat. No. 5,610,684 discloses a projection objective which has a changer for interchanging pupil filters in the pupil plane of the projection objective. The changer comprises displacement devices for displacing lenses close to the pupil, in order to provide sufficient space for the interchanging process. In EP 0 638 847 B1 (corresponding to U.S. Pat. No. 5,448,336), a projection objective having a pupil filter interchanging device is shown, the operation of which requires no movement of lenses close to the pupil. The technical implementation of interchanging devices of this type is very complicated in high-performance projection objectives, since close tolerances for material, fit and thickness of the optical components used and high requirements on the positioning accuracy and, possibly, gas tightness are imposed.

SUMMARY OF THE INVENTION

It is an object of the invention to provide a method of pupil filtering and a corresponding optical imaging system which make it possible to permit the use of pupil filters that act differently without any intervention in the optical system. It is another object to provide pupil filtering which in particular is adapted to the conditions in catadioptric or catoptric projection objectives for microlithography.

As a solution to these and other objects, this invention, according to one formulation, provides a method of imaging a pattern arranged in the object plane of an optical imaging system into the image plane of the imaging system with the aid of an imaging system which has a plurality of optical elements, which are arranged along an optical axis and comprise at least one mirror arranged in the region of a pupil surface of the imaging system, the method having the following steps: locally resolving filtering of the light passing through the imaging system in the region of the mirror in accordance with a variable filter function. According to another formulation there is provided an optical imaging system for imaging a pattern arranged in the object plane of the imaging system into the image plane of the imaging system, the imaging system having a plurality of optical elements, which are arranged along an optical axis and comprise at least one mirror arranged in the region of a pupil surface of the imaging system the mirror being subdivided into a plurality of mirror segments and at least some of the mirror segments being in each case assigned a drive device for moving the mirror element relative to other mirror elements. According to another formulation there is provided a mirror having a carrier structure to be incorporated in a fixed location, and a mirror layer applied to a mirror substrate, a drive device being arranged between the carrier structure and the mirror layer and being formed in such a way that, by driving the drive device, a distance between the carrier structure and the mirror layer can be changed in a controlled manner in predefined regions of the mirror.

Advantageous developments are specified in the dependent claims. The wording of all the claims is hereby incorporated by reference in the content of the description.

The method according to the invention of imaging a pattern applied in the object plane of an optical imaging system into the image plane of the imaging system makes use of an imaging system which has a plurality of optical elements, which are arranged along an optical axis and comprise at least one mirror arranged in the region of a pupil surface of the imaging system. Locally resolving filtering of the light passing through the imaging system in the region of the mirror in accordance with a variable or changeable filter function is proposed. In particular, the mirror itself is used as a variable pupil filter. The method can be applied in particular in all catoptric or catadioptric projection objectives in which at least one imaging, concavely or convexly curved mirror is provided and located in the region of a pupil surface. In this case, the mirror surface can substantially coincide with the pupil surface but it is also possible, at least locally, for there to be a distance between mirror surface and pupil surface. Said distance can be matched to the desired local resolution during the pupil filtering. By means of specifically changing reflective characteristics of the incorporated mirror, the filter function can be changed without replacement of the pupil filter being needed.

The mirror can be formed as an amplitude filter. This can be achieved, for example, by the reflective power of the mirror used varying over the mirror surface (locally resolving) and by it being possible to switch between different reflectance curves.

Embodiments in which locally resolving phase filtering is carried out in the region of the mirror are preferred. For this purpose, according to a preferred development, the mirror or the mirror surface used optically is subdivided into a number of mirror segments which can at least partly be moved relative to one another. At least some of the mirror segments are in each case assigned a drive device for moving the mirror element relative to other mirror elements, in particular with a movement component that can be oriented parallel to an optical axis. By means of controlled movement of mirror segments relative to one another with movement components parallel to the optical axis, the mirror geometry is varied locally differently or in a locally resolving manner and it is possible for optical path lengths of light rays passing through the imaging system to be varied relative to one another in a locally resolving manner in accordance with a predefined filter function by means of the movement of the mirror elements in the region of the pupil surface. This is because, by controlling the axial position of the segments, specific path differences or optical path length differences between rays reflected on different segments can be set.

By means of specific control of the axial position of various mirror segments that are directly adjacent or adjacent at a distance, continuous or stepwise setting and adjustment of the filter function is possible, the local components of the filter function being defined by position, shape and size of the mirror segments and it being possible for the achievable path differences to be adjusted continuously or step by step by means of the extent of the relative movement of the segments in relation to one another.

Tilting individual mirror segments or groups of segments can be used for the purpose of masking out light region by region or in a locally resolving manner, which means that the function of an amplitude filter can be achieved.

The great advantage as compared with the prior art is thus that, for the setting of different filter functions, it is not necessary to interchange with one another pupil filters each having a fixedly predefined filter function. Instead, the achievable filter function in the incorporated filter element can be set by means of specific relative movement of the mirror segments with respect to one another. A variable pupil filter is therefore provided.

In one development, the mirror comprises a number of annular or annular-segment-shaped mirror segments, which are arranged concentrically in relation to a center which preferably, in the incorporated mirror, coincides with the optical axis of the imaging system. This embodiment is adapted for rotationally symmetrical filter functions. The radial width of annular zones or the radius of a circular core zone can be adapted to the desired spatial resolution in the radial direction. In the most highly illuminated region of the pupil, there can be, for example, between two and ten to twenty or more annular zones.

In other embodiments, provision is made for the mirror to have a number of polygonal mirror segments which, for example, have a triangular, square or hexagonal segment shape. The mirror segments preferably lie so close to one another that they substantially fill the area of the illuminating region of the mirror, so that gaps which may possibly be present make up no more than about 1% of the total area. A hexagonal honeycomb shape of the mirror segments is beneficial to producing different spatial distributions of path differences. In principle, each mirror segment can be viewed as an image element or "pixel" in the Fourier domain. The number of "pixels" and the pixel size can be matched to the requirements. The number of polygonal segments can, for example, lie between about 10 and about 30 to 100 or more.

Dividing up the effective mirror surface into such mirror segments also permits the setting of non-rotationally symmetrical and/or eccentric filter functions in order, for example, to implement a linear course of a path difference transversely across the pupil filter or other spatial filter functions. For example, it is possible to set radially non-symmetrical pupil filter functions and/or, in the case of multiple exposure, to change quickly and simply between different pupil functions. Suitable filter functions are, in particular, on functions or function combinations which are described in the articles "Printing Isolated Features with $K_1$=0.2 using Multiple-Pupil Exposure" by R. M. von Bünau and H. Fukuda, Jpn. J. Appl. Phys. Vol. 35 (1996) pages 6400-6403 and "Effects of radially non-symmetric pupil filters and multiple-pupil exposure" by R. M. von Bünau, H. Fukuda and T. Terasawa, SPIE Vol. 2726, pages 375-385. The disclosure content of these articles in this respect is incorporated by reference in the content of this description. Non-rotationally symmetrical filters can be advantageous, for example, if the mirror is operated at an angle differing from the perpendicular incidence of light or if contact holes in a dense grid with different grid spacings are arranged in mutually perpendicular spatial directions. A multiple exposure with a change between rotationally symmetrical and non-rotationally symmetrical filter function can, for example, improve resolution when imaging very thin lines. Superimposed exposure with a change between symmetrical or antisymmetrical functions with respect to two orthogonal axes can result in fourfold symmetry of the imaging properties, which can provide improvements with respect to edge sharpness or corner sharpness for specific structures.

In order to permit a wide range of variation when setting different filter functions, provision is made in preferred embodiments for a plurality of mirror elements that are capable of being driven separately from one another, in order to be able to carry out different movements. In particular, each of the movable mirror elements can be assigned a drive device that can be driven separately for the controlled movement of the mirror segment. Embodiments in which a drive device for a mirror segment has at least one piezoelectric crystal are particularly beneficial. For example, between a substrate to be incorporated in a fixed position or a carrier of the mirror and the mirror layer responsible for the reflection, a control layer or drive layer consisting of piezoelectric material can be arranged, being formed in such a way that, by means of driving the control layer electrically, its layer thickness and therefore the distance between the substrate or the carrier and the mirror layer can be varied in a controlled manner. In addition, other effects which, as a reaction to an electric or magnetic signal, effect a change in the dimension of a material, for example magnetostriction, can be used to construct drive devices or control layers of mirrors according to the invention. Drive devices for moving mirror segments can also operate in accordance with other principles, for example by means of an electric motor or fluid mechanics.

The invention can be used particularly advantageously in catadioptric or catoptric projection objectives for microlithography but also for other imaging systems, for example microscopes.

The above and further features emerge from the description and the drawings as well as from the claims, it being possible for the individual features to be implemented in each case on their own or in a plurality in the form of some sub-combinations in an embodiment of the invention and in other fields and to represent embodiments which are advantageous and intrinsically capable of protection.

DETAILED DESCRIPTION OF PREFERRED EMBODIMENTS

Figure 1:
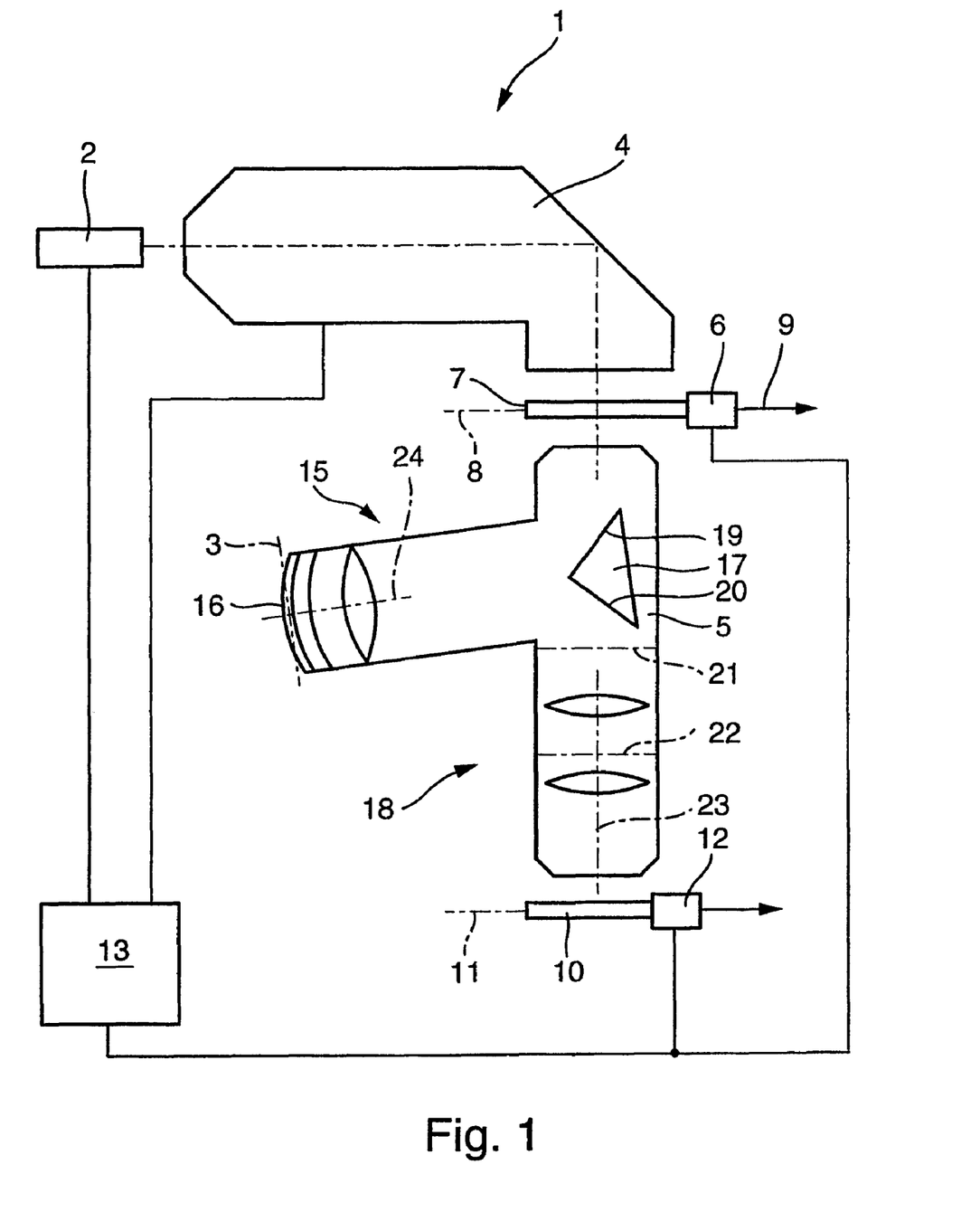
FIG. 1 is a schematic illustration of a microlithography projection exposure installation constructed as a wafer stepper and having a catadioptric projection objective according to one embodiment of the invention.

FIG. 1 shows in schematic form a microlithography projection exposure installation in the form of a wafer stepper 1, which is provided for the production of highly integrated semiconductor components. The projection exposure installation comprises as light source an excimer laser 2, which emits light with an operating wavelength $\lambda$ which is 248 nm in the example and, in other embodiments, can also be below this, for example 193 nm or 157 nm. An illumination system 4 arranged downstream produces a large, sharply delimited and homogeneously illuminated image field, which is matched to the telecentric requirements of the projection objective 5 connected downstream. The projection objective 5 is a preferred embodiment of an optical imaging system according to the invention. The illumination system has devices for selecting the illumination mode and, for example, can be switched over between conventional illumination with a variable degree of coherence, annular field illumination and dipole or quadrupole illumination. Arranged behind the illumination system is a device 6 for holding and manipulating a mask 7, in such a way that the mask (reticle) lies in the object plane 8 of the projection objective and can be moved in this plane in a direction of movement 9 (y direction) with the aid of a scanner drive for the purpose of scanner operation.

Behind the mask plane 8 there follows the projection objective 5, which acts as a reduction objective and projects an image of the mask on a reduced scale, for example on a scale of 1:4 or 1:5, onto a wafer 10 which is covered with a photoresist layer and which is arranged in the image plane 11 of the reduction objective 5. Other embodiments which are designed for coarser initial structures, for example for maskless lithography, can have greater reductions, for example between 1:20 and 1:200. The wafer 10 is held by a device 12 which comprises a scanner drive, in order to move the wafer synchronously with the reticle 7 and parallel to the latter. All the systems are controlled by a control unit 13.

The projection objective 5 is a catadioptric projection objective with geometric beam splitting. Between its object plane (mask plane 8) and its image plane (wafer plane 11), it has a catadioptric first objective part 15 comprising a concave mirror 16, a geometric beam splitter 17 and, behind the latter, a dioptric second objective part 18. The beam splitter 17, formed as a mirror prism, has a flat first mirror surface 19 for deflecting the radiation coming from the object plane toward the concave mirror 16 and a second mirror surface 20 for deflecting the radiation reflected from the concave mirror in the direction of the purely refractive second objective part 18. The catadioptric objective part is designed in such a way that a freely accessible real intermediate image is located at a distance behind the second deflection mirror 20, in the region of an intermediate image plane 21, and is projected into the image plane 11 by the following lenses of the dioptric objective part. The optical axis 24 of the projection objective is folded at the surfaces 19, 16 and 20.

The object plane 8, the intermediate image plane 21 and the image plane 11 are mutually optically conjugate field planes of the imaging system 5. Between these there are in each case located flat pupil surfaces which are Fourier-transformed in relation to the reticle plane 8 and to the image plane 11. A first, flat pupil surface 3 lies in the region of the imaging concave mirror 16. The pupil plane 22 following the intermediate image plane 21 and closest to the wafer is freely accessible. The adjustable system aperture stop (not shown) of the projection objective is situated in this region.

The exposure installation 1 is designed to achieve resolutions of 0.1 μm or better and high throughputs, and has an image-side numerical aperture (NA) between about 0.65 and about 0.85 or higher. The basic structure of the projection objective can correspond to the structure of the projection objective which is shown in EP-A-0 989 434. Other embodiments operate with physical beam splitting, it being possible for a beam splitter cube (BSC) with a polarization-selective beam splitter layer, for example, to be provided instead of the geometric beam splitter 17. There are also intermediate-image-free embodiments of catadioptric projection objectives according to the invention in which a concave mirror is arranged in the region of a pupil surface. Possible embodiments are shown, for example, in DE 42 03 464 or U.S. Pat. No. 5,537,260.

Figure 2:
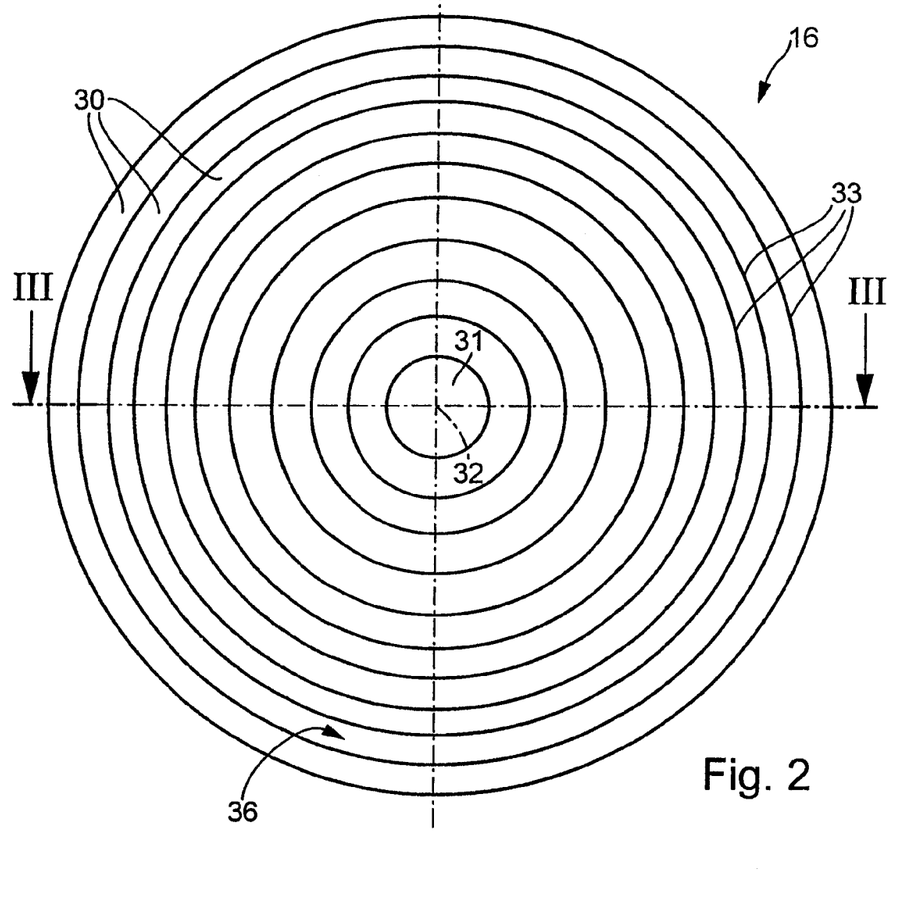
FIG. 2 is an axial plan view of the mirror surface of a concave mirror subdivided into concentric rings for a catadioptric projection objective.

One special feature of the projection objective 5 is that the concave mirror 16 is designed as a variable pupil filter with an electrically adjustable filter function. A preferred embodiment having a rotationally symmetrical filter function will be explained by using FIGS. 2 to 4. The axial plan view of the surface of the concave mirror 16 in FIG. 2 shows that the mirror or the mirror surface has a number of, for example, ten annular mirror segments 30 which surround a central, circular mirror segment 31. The central axis 32 of this rotationally symmetrical arrangement, when the mirror 16 is incorporated, coincides with the point of intersection between the optical axis 24 of the projection objective and the mirror surface and runs symmetrically between the parts of the optical axis which run toward one another at an acute angle on the mirror. The annular mirror surfaces of the individual mirror segments fill up the entire area of the mirror 16 virtually without gaps, so that only in the region of the contact lines 33 lying between the mirror segments do non-reflective regions remain, of which the total area is considerably less than about 1% of the total area of the mirror. Instead of complete rings, the mirror segments can also be shaped like annular segments.

Figure 3:
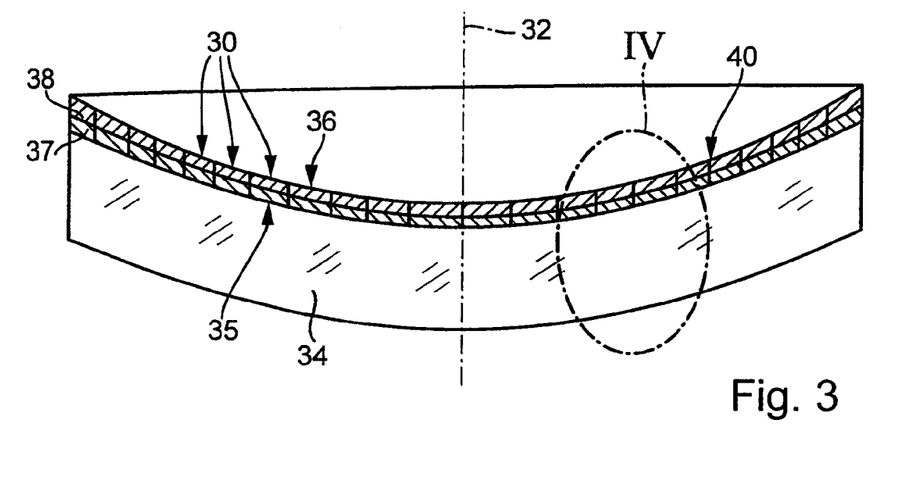
FIG. 3 is a section along the line III-III in FIG. 2.
Figure 4:
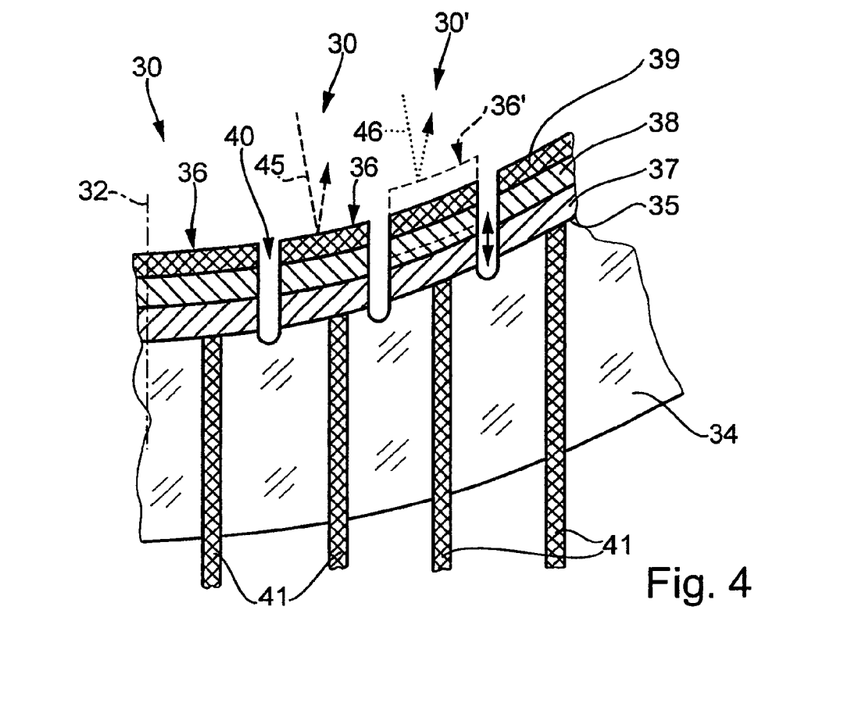
FIG. 4 is an enlarged illustration of the region IV from FIG. 3.

As the vertical sections of FIGS. 3 and 4 show, the mirror has a mirror substrate 34 which, for example, can consist of a glass ceramic such as Zerodur (registered trademark), a silicon carbide ceramic, a titanium silicon glass such as ULE (registered trademark) or another torsionally rigid material with a low thermal coefficient of expansion. The mirror substrate has a substrate surface 35 which is provided for the application of a reflective layer and whose concavely curved shape substantially corresponds to the desired shape of the mirror surface 36 to be applied. A layer 37 of a piezoelectrically active material is applied to the smoothly polished substrate surface 35, being, for example, a piezoceramic based on $PbZrTiO_3$, which can be applied in a sol-gel process. When electrically conductive materials are used as a substrate material, an insulating layer consisting of electrically insulating material is provided between the mirror substrate 34 and the piezoelectric layer 37 and can be dispensed with in the exemplary embodiment, since the mirror substrate 34 consists of insulating glass ceramic. A protective layer 38, which consists of quartz in the example, is applied to the possibly polished free surface of the piezoceramic layer 37. The protective layer 38 is used as a base for the mirror layer 39 applied to it, for which reason the surface of the protective layer that faces away from the substrate 34 must be polished to the desired shape of the mirror surface. The reflective layer 39 can be constructed as an alternating layer pack having dielectric materials of different reflective indices. A mirror layer of electrically conducting material, for example of aluminum, is likewise possible. In order to increase the reflectivity, this can further be coated with one or more dielectric layers, if appropriate.

The layer structure built up in this way is divided along concentric lines, which can correspond to the contact lines 33 in FIG. 2, by means of deep cuts 40 which lead from the mirror surface 36 into the substrate 34. As a result, mirror segments 30 are produced which are separated electrically and physically from one another and in each case have a layer structure in which a piezoceramic layer 37 is arranged between the substrate 34 to be incorporated in a fixed position and the respective mirror surface 36.

To each of the mutually electrically insulated piezoceramic layer sections there leads a hole which leads from the rear of the substrate to the substrate surface 35 and in which an electric feed line 41 that makes contact with the associated piezoelectric layer 37 is led. The piezoelectric layer 37 and the feed lines are configured in such a way that, in the event of electrical activation of the piezoelectric layer via the feed lines 41, the piezoelectric layer changes its layer thickness on account of the inverse piezoelectric effect, as a result of which the distance between the respective reflective surface 36 of the mirror segment and the substrate 34 becomes specifically capable of variation. The arrangement is designed electrically and mechanically such that the achievable stroke in the direction parallel to the central axis 32 of the mirror arrangement is at least of the order of magnitude of half the operating wavelength, that is to say for example of the order of magnitude of about 100 nm.

The structure explained is preferably produced in such a way that, first of all, the mirror substrate 34 is provided with the holes for the feed lines 41 and the latter are mounted in the holes. The upper side of the substrate 35 is then polished and the piezoelectric layer 37 and the quartz layer 38 located above and also, if appropriate, further layers are applied one after another. Then, for example by a lithographic process, concentric rings or other structures are cut into the protective layer 38 and the piezoelectric layer 37. The surfaces remaining outside the cuts 40 form the later phase-shifting areas of the mirror filter. In the last operation before the use of the mirror, the reflective layer 39 is applied.

The mode of operation of the mirror, which can be used as a phase-shifting pupil filter, will be explained in connection with FIG. 4. This shows two light rays 45 (dashed) and 46 (dotted), illustrated schematically, which, parallel to each other and substantially parallel to the optical axis 24 of the projection objective, fall on to two adjacent mirror segments 30, 30' separated from each other by an incision 40. In a basic configuration of the mirror, in which the adjacent mirror surfaces lie substantially at one level in relation to the substrate, the rays 45, 46 do not experience any difference in path during reflection at the mirror surfaces, so that after the reflection they have the same phase difference as in the light path before the reflection. If then, for example, the piezoelectric layer associated with the mirror segment 30' shown on the right is energized electrically in such a way that its thickness is increased, the distance between the substrate 34 and the associated mirror surface 36' is also enlarged. This situation, with the mirror surface 36' raised, is shown dashed. For the two light rays 45, 46, the result is now a path difference that depends on the stroke of the mirror surface 36', that is to say a difference in the optical path length, since the optical path length of the ray 46 is shortened in comparison with that of the ray 45, as a result of the lifting movement of the mirror surface 36'. In this way, a concentrically annular phase filter can be created which, in specific annular zones of the object pupils, effects a sudden phase shift in the light of 180° (or a sudden phase shift of another magnitude). The filter action can be set as desired by means of specific activation of the mirror segments or switched off and also, if appropriate, varied continuously or in steps. The parts of the piezoceramic layer 37 assigned to the respective mirror segments serve here as drive devices that can be electrically driven separately for the independent movement of the individual mirror segments.

Figure 5:
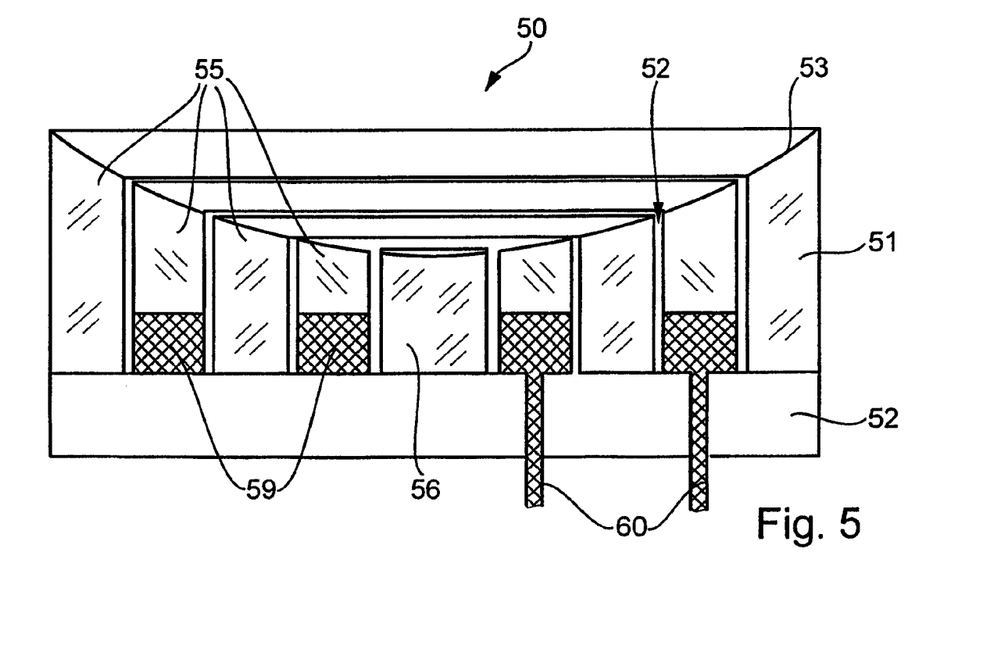
FIG. 5 is an axial section through another embodiment of a concave mirror according to the invention.

FIG. 5 shows another embodiment of a concave mirror 50 which can be used as a phase-shifting pupil filter with a rotationally symmetrical filter function. In this embodiment, the mirror substrate 51, consisting of a glass ceramic, is fixed to a baseplate 52 by adhesive bonding or wringing or in another way. The material of the baseplate 52 has substantially the same thermal expansion characteristics as the mirror substrate material and can be fabricated from the same material. The concavely curved and polished surface of the mirror substrate bears the reflective layer 53. The mirror substrate has a number of concentric ring segments 55, for example four, which surround a circular center piece 56 and are separated by a narrow gap going through to the baseplate 52. In the example, in each second ring segment 55 a continuous annular layer 59 of piezoelectric material is applied between the baseplate 52 and the associated ring 55 of the substrate, which can be fixed to the piezoelectric layer located underneath, for example by means of wringing or of adhesive bonding. The feed lines 60 for the power supply to the piezoelectric rings 59 serving as drive devices of the mirror segments are led through the baseplate 52 here. The effect of this arrangement is that, in the event of electrical activation of the piezoceramic rings 59, as a result of the associated thickness change of the layers 59, the associated movable mirror segments 55 are raised or lowered relative to the radiantly adjacent, respectively immovable mirror segments. In this way, a concentrically angular phase filter can be created which, in specific angular zones of the objective pupils, can effect a sudden phase shift of the light to a predetermined extent (for example 180°).

Since, in embodiments of this type, the drive devices 59 for the movable mirror segments are not integrated in the sensitive layer structure close to the surface but are applied between relatively rugged parts of the subconstruction, specifically between the mirror substrate 51 and baseplate 52, the piezoceramic drive devices 59 can be replaced particularly simply by other types of drive devices which permit a controlled lifting drive of the mirror segments 58. Possible, for example, are micromotors which can be driven electrically or in another way or piston-cylinder drives that can be operated with a working fluid.

Figure 6:
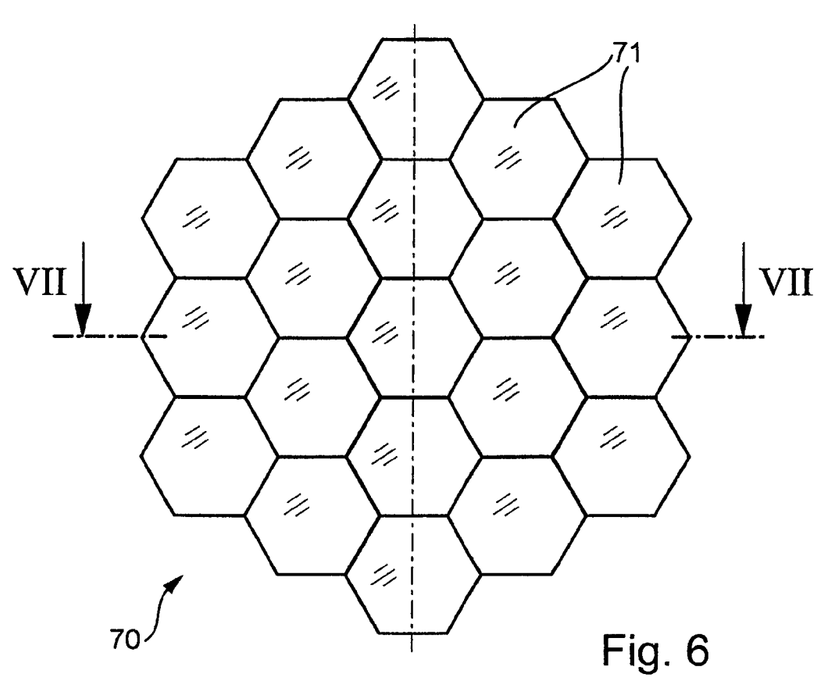
FIG. 6 is a schematic axial plan view of a mirror surface of a concave mirror according to another embodiment of the invention.
Figure 7:
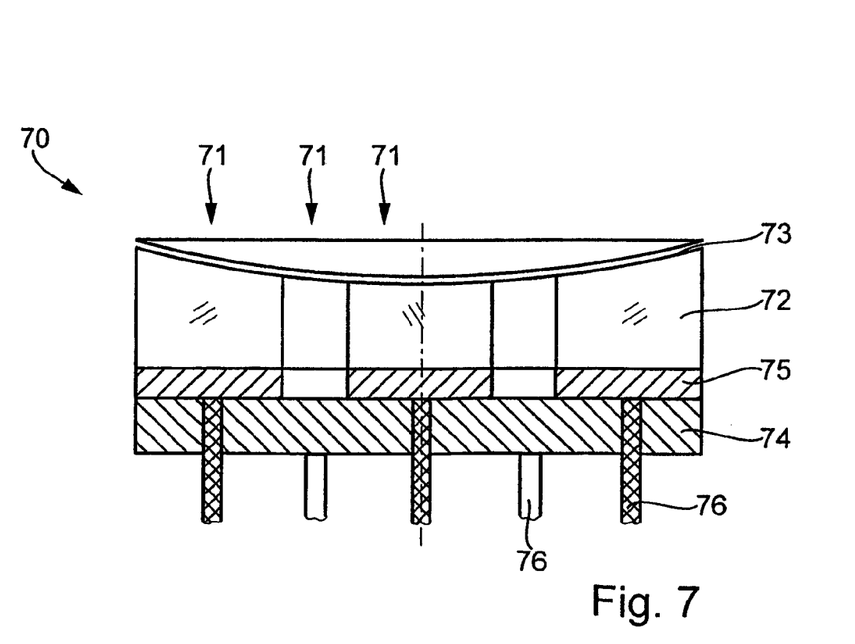
FIG. 7 is a sectional illustration of the concave mirror in FIG. 6 along the line VII-VII.

The embodiment of a phase-shifting concave mirror 70 explained by using FIGS. 6 and 7 is an example of a design in which the size and shape of the phase-shifting regions can be set with great variability. Here, the complete mirror 70 is built up from hexagonal honeycombs 71 which form the mirror segments which fill up the entire mirror area of the mirror virtually without gaps. The structure of the subconstruction resembles the structure in FIG. 5. Between the mirror substrate 72, which bears the reflective layer 73 on its polished, concave surface, and a baseplate 74, in each of the mirror segments 71, a six-sided piezoelectric crystal 75 corresponding to the honeycomb shape is provided as a drive device. All the honeycombs are built up on the baseplate through which the feed lines 76 for the piezoelectric crystals 75 which form the electric lifting drives of the honeycomb mirror segments lead. The parts 74, 75 and 72 can be permanently connected to one another, for example by means of wringing or adhesive bonding. The mirror layer is coated after the mounting of the honeycomb elements.

All the honeycomb mirror segments 71 can be moved separately from one another at right angles to the plane of the baseplate 74, it being possible for a lifting movement or lowering movement to be achieved by means of electrical activation of the associated piezoelectric drives 75. In the case of a mirror 70 incorporated close to the pupil, each honeycomb mirror surface forms a reflective image element or "pixel" in the Fourier domain. By means of synchronous activation of predefined groups of adjacent, physically contiguous, honeycomb mirror elements, it is possible to set filter functions with various spatial distributions of the desired path differences, so that even pupil filters with a non-rotationally symmetrical filter function are possible. The pixel size and therefore the spatial resolution of the pupil filter can be predefined through the size of the individual honeycombs.

The invention has been explained by way of example using catadioptric microlithographic projection objectives, which represent a preferred area of application of the invention. The invention can also be used in other optical imaging systems, for example in catoptric projection objectives in which all the optical elements are mirrors, or in microscopes. In order to achieve the filter action, if appropriate, an adaptive mirror having a profile of the mirror surface which can be varied continuously within certain deflection limits can also be used to an approximation. However, this has the disadvantage that sudden phase shifts, such as are present in theoretically ideal filters, cannot be implemented. Pupil filters according to the invention can alternatively or additionally also be designed as amplitude filters. For example, a mirror subdivided into mirror segments can contain mirror segments that can be tilted, so that, by tilting the segments, the proportion of light respectively incident on the latter is masked out and hence does not contribute to the production of an image. In this case, a plurality of actuators that can be driven independently can be assigned to a mirror segment, if appropriate.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A process for producing at least one of semiconductor components and other finely structured components comprising:
   providing a projection objective having a mirror that is located within a predetermined proximity to a pupil surface of the projection objective;
   providing a mask with a predefined pattern in the region of an object plane of the projection objective;
   illuminating the mask with light of a predefined wavelength;
   projecting an image of the pattern onto a light-sensitive substrate arranged in a region of an image plane of the projection objective optically conjugated to the object plane;
   wherein the projection comprises multiple exposures of the substrate, where a first pupil filter function is set on the mirror during a first exposure and, during a subsequent second exposure, a different, second pupil filter function is set by local changes of geometric reflective properties of the mirror in a locally resolving manner.

2. The process according to claim 1, wherein at least one of the first and second pupil filter functions is a radially non-symmetric filter function.

3. The process according to claim 1, wherein at least one of the first and second pupil filter functions is a radially non-symmetric pupil filter function and another of the first and second pupil filter functions is a radially symmetric pupil filter function.

4. The process according to claim 1, wherein at least one of the first and second pupil filter functions is an eccentric pupil filter function.

5. The process according to claim 1, wherein at least one of the first and second pupil filter functions causes a linear course of a path difference of reflected rays across the mirror.

6. The process according to claim 1, wherein one of the first and second pupil filter functions is a rotationally symmetric pupil filter function and another of the first and second pupil filter functions is a non-rotationally symmetric pupil filter function.

7. The process according to claim 1, wherein the mirror is a concave mirror configured as a variable pupil filter with an electrically adjustable filter function.

8. The process according to claim 1, wherein a surface profile of the mirror is varied continuously within certain deflection limits between the first exposure and the second exposure.

9. The process according to claim 1, wherein the mirror has a continuous mirror surface and wherein the surface profile of the mirror is varied between the first exposure and the second exposure.

10. The process according to claim 1, wherein the projection objective is a catoptric projection objective having a plurality of optical elements where all optical elements are mirrors.

11. The process according to claim 1, wherein the projection objective is a catadioptric projection objective having lenses in addition to the mirror.

12. The process according to claim 1, wherein light passing from the object plane to the image plane forms an intermediate image between the object plane and the image plane.

13. A projection objective for imaging a pattern arranged in the object plane of the projection objective into the image plane of the projection objective, the projection objective being configured to perform the process claimed in claim 1.

14. The projection objective according to claim 13, wherein the mirror has a continuous surface profile which is varied continuously within certain deflection limits between the first exposure and the second exposure.

15. The projection objective according to claim 13, wherein the mirror is a concave mirror configured as a variable pupil filter with an electrically adjustable filter function.

16. A process for producing at least one of semiconductor components and other finely structured components comprising:
providing a projection objective having an object plane, an image plane optically conjugated to the object plane, and a mirror that is located within a predetermined proximity to a pupil surface of the projection objective;
setting a first pupil filter function on the mirror for a first exposure of a light-sensitive substrate arranged in a region of the image plane;
performing the first exposure by projecting an image of a pattern onto the substrate;
locally changing geometric reflective properties of the mirror in a locally resolving manner to set a second pupil filter function which is different from the first pupil filter function;
performing a second exposure after the first exposure.

17. The process according to claim 16, wherein the process comprises multiple exposures of the same substrate, one exposure of the multiple exposures being the first exposure and another exposure of the multiple ex-posures being the second exposure.

18. The process according to claim 16, wherein at least one of the first and second pupil filter functions is a radially non-symmetric filter function.

19. The process according to claim 16, wherein at least one of the first and second pupil filter functions is a radially non-symmetric pupil filter function and another of the first and second pupil filter functions is a radially symmetric pupil filter function.

20. The process according to claim 16, wherein at least one of the first and second pupil filter functions is an eccentric pupil filter function.

21. The process according to claim 16, wherein at least one of the first and second pupil filter functions causes a linear course of a path difference of reflected rays across the mirror.

22. The process according to claim 16, wherein one of the first and second pupil filter functions is a rotationally symmetric pupil filter function and another of the first and second pupil filter functions is a non-rotationally symmetric pupil filter function.

23. The process according to claim 16, wherein the mirror is a concave mirror configured as a variable pupil filter with an electrically adjustable filter function.

24. The process according to claim 16, wherein a surface profile of the mirror is varied continuously within certain deflection limits between the first exposure and the second exposure.

25. The process according to claim 16, wherein the mirror has a continuous mirror surface and wherein the surface profile of the mirror is varied between the first exposure and the second exposure.

26. The process according to claim 16, wherein the projection objective is a catadioptric projection objective having a plurality of optical elements where all optical elements are mirrors.

27. The process according to claim 16, wherein the projection objective is a catadioptric projection objective having lenses in addition to the mirror.

28. The process according to claim 16, wherein light passing from the object plane to the image plane forms an intermediate image between the object plane and the image plane.

29. A projection objective for imaging a pattern arranged in the object plane of the projection objective into the image plane of the projection objective,
the projection objective being configured to perform the process claimed in claim 16,
wherein the mirror has a continuous surface profile which is varied continuously within certain deflection limits between the first exposure and the second exposure.

30. The process according to claim 29, wherein the mirror is a concave mirror configured as a variable pupil filter with an electrically adjustable filter function.

31. The process according to claim 1, wherein light passing from the object plane to the image plane through the projection objective is filtered by the mirror in a locally resolving manner according to a first filter function during the first exposure and according to a second filter function, different from the first filter function, during the second exposure.

32. The process according to claim 16, wherein light passing from the object plane to the image plane through the projection objective is filtered by the mirror in a locally resolving manner according to a first filter function during the first exposure and according to a second filter function, different from the first filter function, during the second exposure.

* * * * *

UNITED STATES PATENT AND TRADEMARK OFFICE
CERTIFICATE OF CORRECTION

| | |
|---|---|
| PATENT NO. | : 7,791,711 B2 |
| APPLICATION NO. | : 12/036903 |
| DATED | : September 7, 2010 |
| INVENTOR(S) | : Hubert Holderer et al. |

It is certified that error appears in the above-identified patent and that said Letters Patent is hereby corrected as shown below:

Column 11, Line 58: delete "ex-posures" and insert -- exposures --

Signed and Sealed this

Twenty-first Day of December, 2010

David J. Kappos
*Director of the United States Patent and Trademark Office*